United States Patent
Gaide et al.

(10) Patent No.: US 9,859,896 B1
(45) Date of Patent: Jan. 2, 2018

(54) DISTRIBUTED MULTI-DIE ROUTING IN A MULTI-CHIP MODULE

(71) Applicant: Xilinx, Inc., San Jose, CA (US)

(72) Inventors: Brian C. Gaide, Erie, CO (US); Steven P. Young, Boulder, CO (US); Eric F. Dellinger, Longmont, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/851,601

(22) Filed: Sep. 11, 2015

(51) Int. Cl.
*H03K 19/177* (2006.01)

(52) U.S. Cl.
CPC . *H03K 19/17744* (2013.01); *H03K 19/17728* (2013.01)

(58) Field of Classification Search
None
See application file for complete search history.

(56) References Cited

U.S. PATENT DOCUMENTS

| | | | |
|---|---|---|---|
| 5,162,260 A | 11/1992 | Leibovitz et al. | |
| 5,225,719 A * | 7/1993 | Agrawal | H03K 19/17704 326/114 |
| 5,270,261 A | 12/1993 | Bertin et al. | |
| 5,323,060 A | 6/1994 | Fogal et al. | |
| 5,327,327 A | 7/1994 | Frew et al. | |
| 5,380,681 A | 1/1995 | Hsu | |
| 5,424,589 A * | 6/1995 | Dobbelaere | G06F 13/4022 326/39 |
| 5,481,133 A | 1/1996 | Hsu | |
| 5,502,333 A | 3/1996 | Bertin et al. | |
| 5,521,122 A | 5/1996 | Kuramochi | |
| 5,552,633 A | 9/1996 | Sharma | |
| 5,561,622 A | 10/1996 | Bertin et al. | |
| 5,568,574 A | 10/1996 | Tanguay, Jr. et al. | |
| 5,629,563 A | 5/1997 | Takiar et al. | |
| 5,633,530 A | 5/1997 | Hsu | |
| 5,652,811 A | 7/1997 | Cook et al. | |
| 5,682,107 A | 10/1997 | Tavana et al. | |
| 5,715,197 A | 2/1998 | Nance et al. | |
| 5,804,004 A | 9/1998 | Tuckerman et al. | |
| 5,880,598 A | 3/1999 | Duong | |
| 5,905,639 A | 5/1999 | Warren | |
| 5,914,616 A | 6/1999 | Young | |
| 5,990,501 A | 11/1999 | Hiyoshi et al. | |
| 6,099,583 A | 8/2000 | Nag | |

(Continued)

OTHER PUBLICATIONS

Kaustav Banerjee, Shukri J. Souri, Pawan Kapur and Krishna C. Saraswat, "3-D ICs: A Novel Chip Design for Improving Bannerjee, Kaustav et al, 3-D ICs: A Novel Chip Design for Improving Deep-Submicrometer Interconnect Performance and Systems-on-Chip Integration," Proc. of the IEEE, May 2001, pp. 602-633, vol. 89., No. 5, IEEE, Piscataway, New Jersey, USA.

(Continued)

*Primary Examiner* — Crystal L Hammond
(74) *Attorney, Agent, or Firm* — Robert M. Brush

(57) ABSTRACT

In an example, a programmable integrated circuit (IC) includes external contacts configured to interface with a substrate and a plurality of configurable logic elements (CLEs) distributed across a programmable fabric. The programmable IC further includes interconnect circuits disposed between the plurality of CLEs and the external contacts. A plurality of the interconnect circuits is disposed in the plurality of CLEs.

20 Claims, 6 Drawing Sheets

(56) References Cited

U.S. PATENT DOCUMENTS

| | | | |
|---|---|---|---|
| 6,114,221 A | 9/2000 | Tonti et al. | |
| 6,191,613 B1 | 2/2001 | Schultz et al. | |
| 6,255,736 B1 | 7/2001 | Kaneko | |
| 6,271,059 B1 | 8/2001 | Bertin et al. | |
| 6,337,579 B1 | 1/2002 | Mochida | |
| 6,368,930 B1 | 4/2002 | Enquist | |
| 6,396,302 B2 | 5/2002 | New et al. | |
| 6,410,431 B2 | 6/2002 | Bertin et al. | |
| 6,444,560 B1 | 9/2002 | Pogge et al. | |
| 6,446,249 B1 * | 9/2002 | Wang | G06F 17/5027 326/38 |
| 6,501,663 B1 | 12/2002 | Pan | |
| 6,570,404 B1 * | 5/2003 | Norman | H03K 19/17704 326/38 |
| 6,580,164 B1 | 6/2003 | Ohie | |
| 6,849,951 B1 | 2/2005 | Trimberger et al. | |
| 6,917,219 B2 | 7/2005 | New | |
| 7,068,072 B2 | 6/2006 | New et al. | |
| 7,339,400 B1 * | 3/2008 | Walstrum, Jr. | H03K 19/17768 326/101 |
| 7,345,508 B1 * | 3/2008 | Jang | H03K 19/17736 326/38 |
| 7,484,027 B1 * | 1/2009 | Dahlin | G06F 13/4072 710/305 |
| 7,518,396 B1 * | 4/2009 | Kondapalli | H03K 19/17776 326/38 |
| 7,525,340 B2 * | 4/2009 | Shumarayev | H03K 19/17704 326/37 |
| 8,415,975 B1 * | 4/2013 | Birsan | G06F 13/00 326/38 |
| 8,611,159 B1 * | 12/2013 | Sasaki | G11C 29/022 365/189.02 |
| 8,674,235 B2 * | 3/2014 | Hossain | H01L 23/49838 174/261 |
| 8,786,308 B1 * | 7/2014 | Loh | H03K 19/17764 326/10 |
| 2001/0030555 A1 | 10/2001 | Witting et al. | |
| 2002/0008309 A1 | 1/2002 | Akiyama | |
| 2002/0064906 A1 | 5/2002 | Enquist | |
| 2003/0052712 A1 * | 3/2003 | Comer | H01L 23/5252 326/38 |
| 2004/0238936 A1 * | 12/2004 | Rumer | H01L 23/481 257/688 |
| 2005/0275750 A1 * | 12/2005 | Akram | H01L 27/14634 348/374 |
| 2006/0125084 A1 * | 6/2006 | Fazzio | B81C 1/00238 257/704 |
| 2007/0170554 A1 * | 7/2007 | Camacho | H01L 21/568 257/666 |
| 2011/0316163 A1 * | 12/2011 | Do | H01L 21/4832 257/773 |
| 2012/0191921 A1 * | 7/2012 | Shaeffer | G06F 13/1678 711/149 |
| 2012/0305303 A1 * | 12/2012 | Hossain | H01L 23/49838 174/260 |
| 2016/0300815 A1 * | 10/2016 | Kim | H01L 25/0657 |

OTHER PUBLICATIONS

Romanelli, Alexi, "Intel Stacks Flash Deck in its Favor," Electronic News, Apr. 10, 2003, pp. 1-2, available from Reed Electronics Group, http://www.e-insite.net/electronicnews/index.asp?layout=article&articleid-=CA291318.

Xilinx, "Virtex-II Pro Platform FPGA Handbook," UG012 (v2.0), Oct. 14, 2002, pp. 27-71, Xilinx, Inc., San Jose, California, USA.

* cited by examiner

DISTRIBUTED MULTI-DIE ROUTING IN A MULTI-CHIP MODULE

TECHNICAL FIELD

Examples of the present disclosure generally relate to electronic circuits and, in particular, to distributed multi-die routing in a multi-chip module (MCM).

BACKGROUND

Programmable integrated circuits (ICs) are often used to implement digital logic operations according to user configurable input. Example programmable ICs include complex programmable logic devices (CPLDs) and field programmable gate arrays (FPGAs). CPLDs often include several function blocks that are based on a programmable logic array (PLA) architecture with sum-of-products logic. A configurable interconnect matrix transmits signals between the function blocks.

One type of FPGA includes an array of programmable tiles. The programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth. Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

Programmable ICs can be part of a larger multi-chip module (MCM) package. For example, an MCM package can include multiple IC die stacked on an interposer or multiple IC die stacked on one another. In such an MCM package, a programmable IC can include circuitry to facilitate die-to-die connectivity. However, such die-to-die connection circuits are often scarce resources, leading to routing congestion when signals compete for resources on the same areas of the programmable IC die.

SUMMARY

Techniques for distributed multi-die routing in a multi-chip module (MOM) are described. In an example, a programmable integrated circuit (IC) includes external contacts configured to interface with a substrate and a plurality of configurable logic elements (CLEs) distributed across a programmable fabric. The programmable IC further includes interconnect circuits disposed between the plurality of CLEs and the external contacts. A plurality of the interconnect circuits is disposed in the plurality of CLEs.

In another example, a multi-chip module includes a substrate and a plurality of integrated circuit (IC) dies disposed on the substrate, the plurality of IC dies including a programmable IC die. The programmable IC die includes external contacts configured to interface with the substrate and a plurality of configurable logic elements (CLEs) distributed across a programmable fabric. The programmable IC die further includes interconnect circuits disposed between the plurality of CLEs and the external contacts. A plurality of the interconnect circuits is disposed in the plurality of CLEs. The multi-chip module further includes conductors disposed on the substrate electrically coupled to the interconnect circuits through the external contacts.

In another example, a method of communication in a multi-chip module having a programmable integrated circuit (IC) includes configuring first multiplexing logic in the programmable IC to couple a configurable logic element (CLE) slice to an external interconnect circuit in a CLE; and configuring second multiplexing logic in the external interconnect circuit to couple the CLE slice to a transmitter in the external interconnect circuit, the transmitter being coupled to an external contact of the programmable IC.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
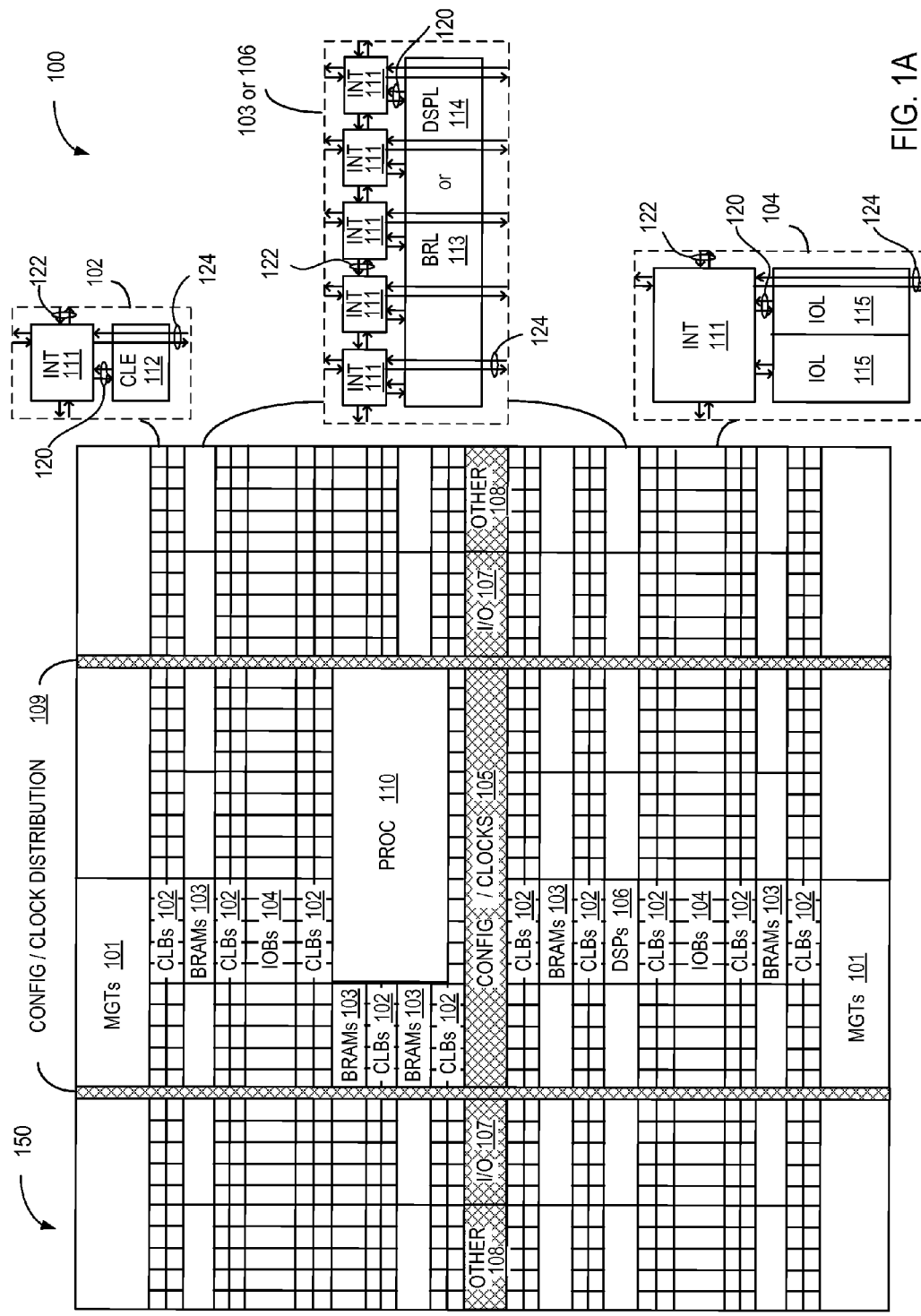
FIG. 1A illustrates an example architecture of a field programmable gate array (FPGA).

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

Techniques for distributed multi-die routing in a multi-chip module (MOM) are described. In an example, a programmable integrated circuit (IC) includes external contacts configured to interface with a substrate, such as solder bumps configured to interface an interposer or package substrate in an MOM. The programmable IC includes a plurality of configurable logic elements (CLEs) distributed across a programmable fabric. The programmable IC further includes interconnect circuits disposed between the plurality of CLEs and the external contacts, where the interconnect circuits are disposed in the CLEs. Since such interconnect circuits are coupled to the external contacts, such interconnect circuits are referred to herein as "external interconnect circuits." Such external interconnect circuits are distinguishable from the general purpose interconnect in the programmable fabric of the programmable IC. The external interconnect circuits can be used to enable efficient die-to-die connectivity within an MOM. The external interconnect circuits can also be used to enable efficient intra-die connectivity within the programmable IC without the need to use the general purpose interconnect. These and other aspects are described below with respect to the following figures.

FIG. 1A illustrates an example architecture of an FPGA 100 that includes a large number of different programmable tiles in a programmable fabric 150, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108, such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1A. Each programmable interconnect element 111 (also referred to as "interconnect element 111") can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA. As described further below, in some examples, some or all of the interconnect elements 111 can include additional circuitry for efficient implementation of TCAMs.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured example, a horizontal area near the center of the die (shown in FIG. 1A) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1A include additional logic blocks that disrupt the regular columnar structure making up a large part of the FPGA. The additional logic blocks can be programmable blocks and/or dedicated logic. For example, processor block 110 spans several columns of CLBs and BRAMs. The processor block 110 can include various components ranging from a single microprocessor to a complete programmable processing system of microprocessor(s), memory controllers, peripherals, and the like.

Note that FIG. 1A is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1A are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. In another example, an FPGA can include an entire processing system (e.g., processor, memory, peripherals, etc.) instead of, or in addition to, the processor block 110. In such an implementation, a System-on-Chip (Soc) can include a programmable fabric (programmable logic as shown in FPGA 100) in communication with a processing system.

Figure 1B:
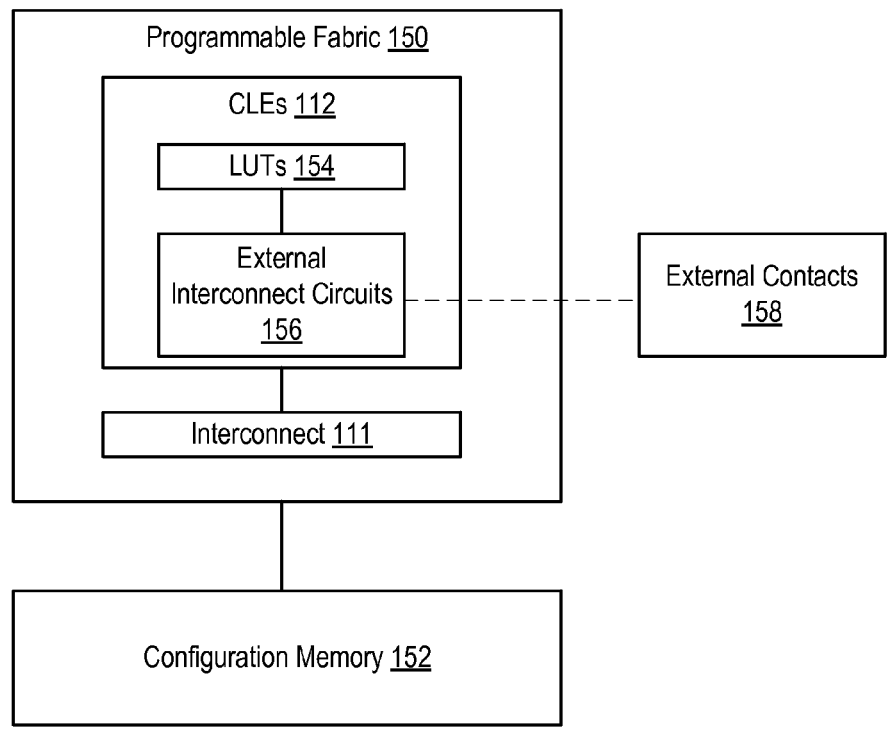
FIG. 1B is a block diagram depicting a higher-level view of the FPGA of FIG. 1A according to an example.

FIG. 1B is a block diagram depicting a higher-level view of the FPGA 100 according to an example. The programmable fabric 150 can include the various programmable tiles described above, including the CLEs 112. The programmable fabric 150 is coupled to a configuration memory 152. The configuration memory 152 comprises a random access memory (RAM), such as a static RAM (SRAM) or the like. The CLEs 112 can include look-up tables (LUTs) 154. The LUTs 154 can be programmed to perform various logic functions, such as combinatorial functions, memory functions, and the like. The CLEs 112 are coupled to the interconnect elements 111, as discussed above. The CLEs 112 also include external interconnect circuits 156. The external interconnect circuits 156 are electrically coupled to external contacts 158 of the FPGA 100. For example, the FPGA 100 can be formed on an IC die in an IC package, and the external contacts 158 can be solder bumps of the IC die. The external interconnect circuits 156 provide an electrical pathway to and from the CLEs 112 and the external contacts 158 without traversing the interconnect 111 or other logic blocks (e.g., IOBs 104). In an example, the FPGA 100 can be formed on an IC die in a multi-chip module (MOM) package having a plurality of IC die. The external interconnect circuits 156 can be used to electrically couple one or more of the CLEs 112 to one or more other IC die in the MOM package (e.g., inter-die or die-to-die connectivity). In another example, the external interconnect circuits 156 can be used to electrically couple one of the CLEs 112 to another of the CLEs 112 within the same IC die through external conductors on the IC package (e.g., intra-die connectivity).

The configuration memory 152 can be loaded with a configuration bitstream for programming ("configuring") the programmable fabric 150. For example, a configuration bitstream can be loaded into the configuration memory 152 to configure the CLEs 112 of the programmable fabric 150, as described herein.

Figure 1C:
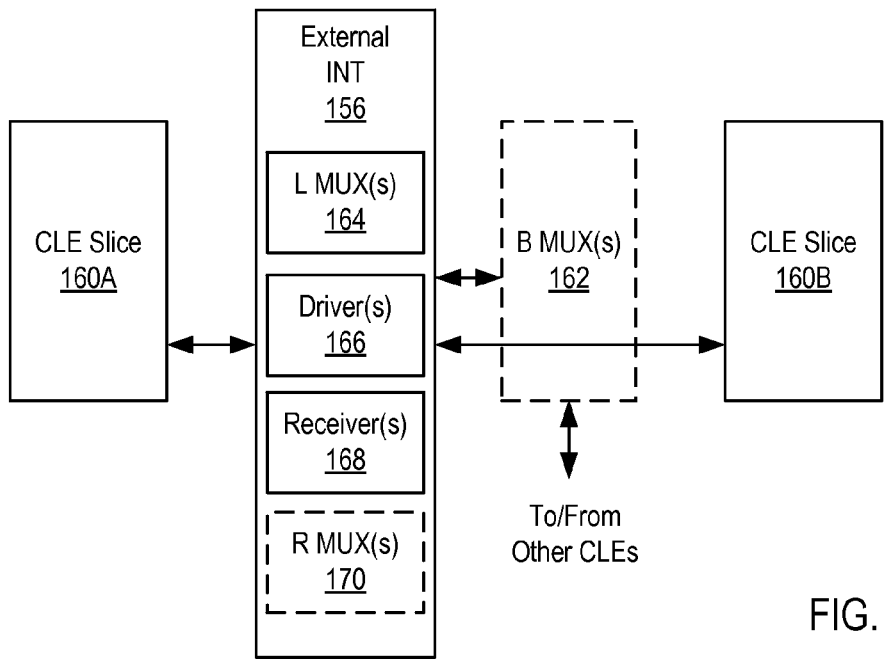
FIG. 1C is a block diagram depicting a more detailed view of the FPGA of FIG. 1A according to an example.

FIG. 1C is a block diagram depicting a more detailed view of the programmable fabric 150 according to an example. The programmable fabric 150 can include a CLE slice 160A and a CLE slice 160B (collectively CLE slices 160). A CLE slice comprises all or a portion of the logic of a CLE 112. The CLE slices 160 can be part of the same CLE 112 or parts of neighboring CLEs 112. The external interconnect circuits (external INT) 156 can include multiplexer logic referred to herein as L mux(s) 164. The external INT 156 can also include one or more drivers 166 and one or more receivers 168. The driver(s) 166 and the receiver(s) 168 can be coupled between the external contacts 158 and the L mux(s) 164. In an example, the external INT 156 can also include multiplexer logic referred to herein as R mux(s) 170. The R mux(s) 170 can be used in examples where the external INT 156 includes a plurality of the drivers 166 and a plurality of the receivers 168 to provide redundancy. In such examples, the R mux(s) 170 can be coupled between the drivers 166/receivers 168 and the L mux(s) 164.

The L mux(s) 164 provide a layer of multiplexing between various connections to facilitate high-speed connections that do not have to traverse local interconnect to transfer from one route to the next. That is, a given connection can traverse one route and hop through one L mux to get to the next route, instead of having to go through multiple multiplexer stages in between.

The CLE slices 160A and 160B can be coupled to the external INT 156. The L mux(s) 164 can be controlled to electrically couple a given CLE slice of the CLE slices 160 to a given external contact of the external contacts 158, which can be coupled to another IC die (inter-die connectivity) or to another one of the external contracts 158 (intra-die connectivity) using an external conductor. In an example, the programmable fabric 150 can include multiplexer logic referred to herein as B mux(s) 162. The B mux(s) 162 can be coupled between the external INT 156 and one or more other CLEs 112. The B mux(s) 162 can be used to increase flexibility, allowing more CLE resources to utilize the external INT 156 for inter-die or intra-die connectivity. The L mux(s) 164, the R mux(s) 170, and the B mux(s) 162 can be controlled using bits of the configuration memory 152 and/or using signals from the CLEs 112.

In one approach, a programmable fabric of an FPGA can include dedicated columns of external interconnect circuits to facilitate die-to-die connectivity. One problem with such an approach is that since die-to-die connections are scarce resources, routing congestion can develop in areas surrounding the external interconnect columns. In examples described herein, the external interconnect circuits 156 are implemented within CLEs 112 and can be distributed throughout the programmable fabric 150. This reduces local routing congestion by distributing the inter-die and/or intra-die connections over a much wider area than can be achieved in the dedicated column approach. Further, the external interconnect circuits 156 include dedicated circuitry to facilitate the inter-die and/or intra-die connections, including the driver(s) 166, the receiver(s) 168, and interconnect resources (e.g., the L mux(s) 164 and the R mux(s) 170). As part of the CLEs 112, the external interconnect circuits 156 can leverage the CLEs' interconnect and register resources at reduced cost than in the dedicated column approach.

Figure 2:
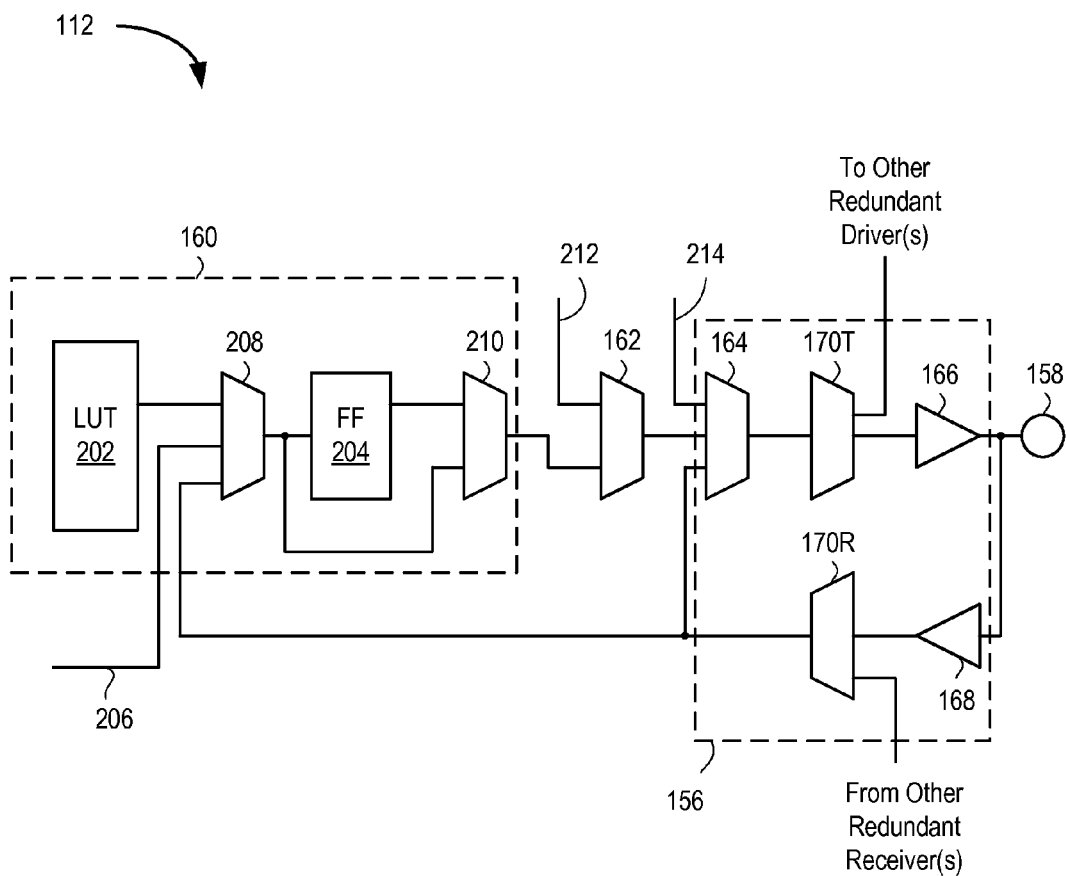
FIG. 2 is a block diagram depicting a portion of a configurable logic element (CLE) of FPGA of FIG. 1A according to an example.

FIG. 2 is a block diagram depicting a portion of a CLE 112 of the programmable fabric 150 according to an example. The CLE 112 includes a CLE slice 160 coupled to an external interconnect circuit 156. The CLE slice 160 includes a LUT 202, multiplexer logic 208, flip-flop (FF) logic 204, and multiplexer logic 210. The LUT 202 is coupled to an input of the multiplexer logic 208. Another input of the multiplexer logic 208 can be coupled to a terminal 206, which can be coupled to another CLE 112. Another input to the multiplexer logic 208 can be coupled to an output of the external interconnect circuit 156. An output of the multiplexer logic 208 can be coupled to an input of the FF logic 204 and to an input of the multiplexer logic 210. An output of the FF logic 204 can be coupled to another input of the multiplexer logic 210. The logic shown in FIG. 2 for the CLE slice 160 is merely exemplary and the CLE slice 160 can have other logic structures being a combination of LUT logic, multiplexer logic, flip-flop logic, and the like.

In the example, the CLE 112 includes a B mux 162. In other examples, the B mux 162 can be omitted. An input of the B mux 162 is coupled to an output of the CLE slice 160. Other input(s) of the B mux 162 can be coupled to terminal(s) 212, which in turn can be coupled to other CLE(s) 112. An output of the B mux 162 is coupled to an input of an L mux 164. If the B mux 162 is omitted, then the output of the CLE slice 160 can be directly coupled to an input of the L mux 164.

Other input(s) of the L mux 164 can be coupled to terminal(s) 214, which in turn can be coupled to other CLE(s) 112 or other CLE slices 160. Another input of the L mux 164 can be coupled to an output of an R mux 170R. An output of the L mux 164 can be coupled to an input of an R mux 170T. An output of the R mux 170T can be coupled to an input of a driver 166. An output of the driver 166 can be coupled to an external contact 158. The R mux 170T can include other output(s) coupled to other driver(s) of the external interconnect circuit 156 (e.g., redundant drivers).

An input of a receiver 168 can be coupled to the external contact 158. An output of the receiver 168 can be coupled to an input of the R mux 170R. An output of the R mux 170R can be coupled to an input of the L mux 164 and to an input of the multiplexer logic 208 in the CLE 112. The R mux 170R can include other input(s) coupled to other receiver(s) of the external interconnect circuit 156 (e.g., redundant receivers).

In operation, the B mux 162 (if present) and the L mux 164 can be controlled to couple the CLE slice 160 to the external contact 158 through the driver 166. Alternatively, the B mux 162 and the L mux 164 can be controlled to couple another CLE coupled to a terminal 212 to the external contact 158 through the driver 166. Alternatively, the L mux 164 can be controlled to couple another CLE or another CLE slice to the external contact 158 through the driver 166. The CLE slice 160 can also be coupled to the external contact 158 through the receiver 168. The driver 166 and the receiver 168 can each be three-state devices having a highimpedance state so that only one of the driver 166 and the receiver 168 is electrically coupled to the external contact 158 at a time.

In the example shown in FIG. 1, the CLE 112 includes one slice and one external interconnect circuit. However, in general, the CLE 112 can include a plurality of slices and a plurality of interconnect circuits. In an example, the CLE 112 can include one or more slices and four external interconnect circuits.

Figure 3:
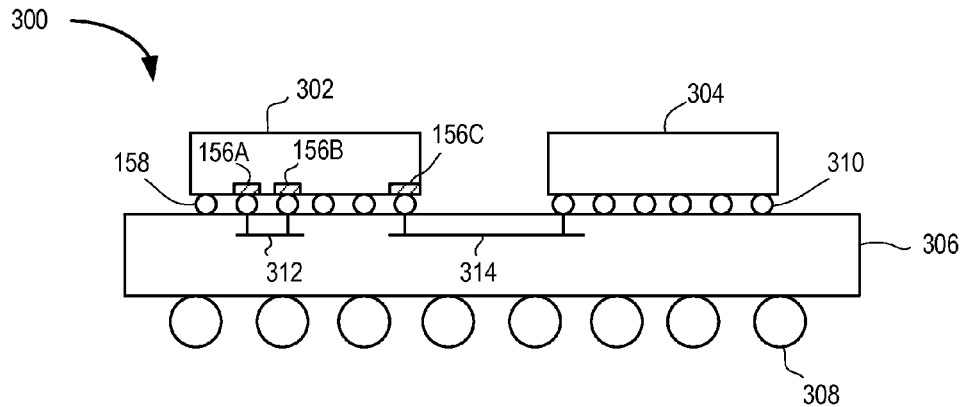
FIG. 3 is a cross-section of a multi-chip module (MCM) having the FPGA of FIG. 1A according to an example.

FIG. 3 is a cross-section of a multi-chip module (MOM) 300 according to an example. The MOM 300 includes an IC die 302, an IC die 304, and a substrate 306. The IC die 302 and the IC die 304 are mechanically and electrically coupled to the substrate 306. The IC die 302 comprises the FPGA 100 described above. The IC die 302 is mechanically and electrically coupled to the substrate 306 through external contacts 158. The IC die 304 can be any type of integrated circuit and is mechanically and electrically coupled to the substrate 306 through the external contacts 310. The substrate 306 includes external contacts 308. The substrate 306 can be a package substrate, an interposer, or the like.

In the example, the IC die 302 includes three instances of an external interconnect circuit 156A, 156B, and 156C. The external interconnect circuit 156C is coupled to the IC die 304 through a conductor 314 of the substrate 306. The external interconnect circuit 156C can be used for inter-die communication. The external interconnect circuits 156A and 156B are coupled to each other through a conductor 312 of the substrate 306. The external interconnect circuits 156A and 156B can be used for intra-die communication. In a practical MOM, the FPGA die can include any number of external interconnect circuits, each of which can be coupled to conductors of the substrate 306 for inter-die communication and/or intra-die communication. Although the conductors 312 and 314 of the substrate 306 are shown on a single layer, the substrate 306 can include any number of conductive layers having conductors coupled to external interconnect circuits of an FPGA die. Moreover, in some examples, external interconnect circuits described herein can be used in a single FPGA package to implement only intra-die communication.

Figure 4:
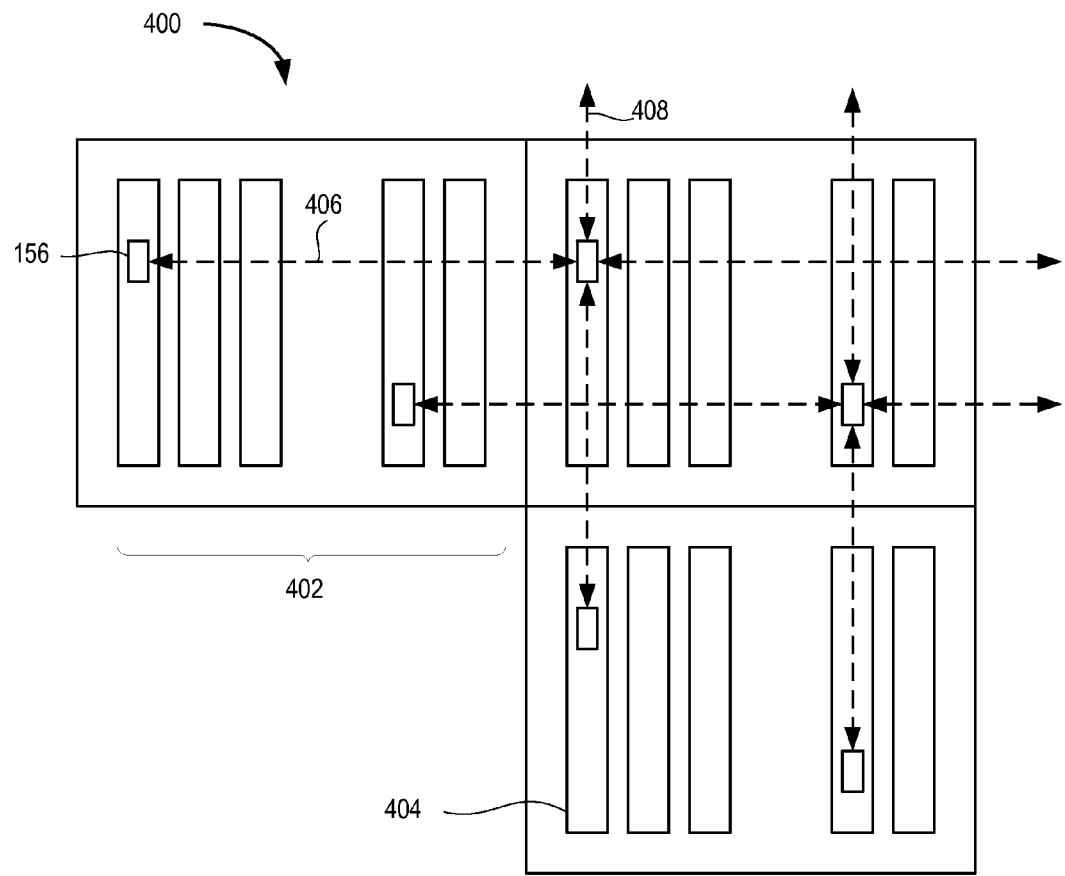
FIG. 4 is a block diagram depicting a portion of a floorplan of the FGPA of FIG. 1A according to an example.

FIG. 4 is a block diagram depicting a portion of a floorplan 400 of the programmable fabric 150 according to an example. The floorplan 400 includes a plurality of sub-regions 402 (e.g., three are shown). Each sub-region 402 includes CLE columns 404. One or more CLEs in each of the CLE columns 404 includes at least one instance of the external interconnect circuit 156. Conductors can be formed on the substrate such that one external interconnect circuit 156 is electrically coupled to another external interconnect circuit 156 (as illustrated by intra-die connection 406). Conductors can be formed on the substrate such that one external interconnection circuit 156 is electrically coupled to another IC (as illustrated by inter-die connection 408). A given CLE can include one or more external interconnect circuits and can support one or more intra-die connections, one or more inter-die connections, or both intra-die and inter-die connections.

Figure 5:
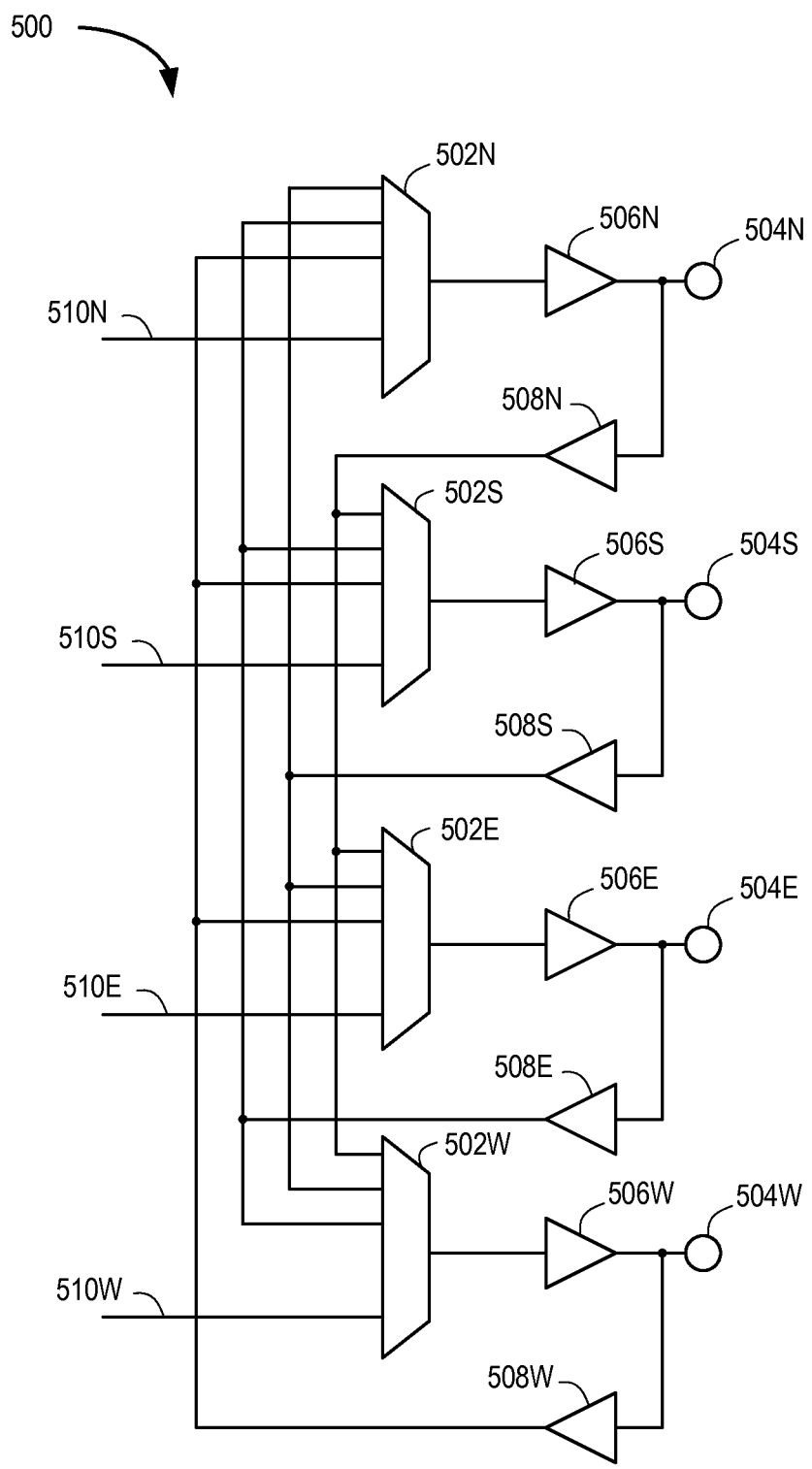
FIG. 5 is a block diagram depicting an example of external interconnect circuitry in a CLE according to an example.

FIG. 5 is a block diagram depicting an example of external interconnect circuitry 500 in a CLE according to an example. In the example, the external interconnect circuitry 500 includes four external interconnect circuits, designated north (N), south (S), east (E), and west (W). The external interconnect circuitry 500 includes four L muxes 502N, 502S, 502E, and 502W, four drivers 506N, 506S, 506E, and 506W, and four receivers 508N, 508S, 508E, and 508W. The driver 506N and receiver 508N are coupled to an external contact 504N; the driver 506S and receiver 508S are coupled to an external contact 504S; the driver 506E and receiver 508E are coupled to an external contact 504E; and the driver 506W and receiver 508W are coupled to an external contact 504W.

The output of the receiver 508N is coupled to inputs of the L muxes 502S, 502E, and 502W. The output of the receiver 508S is coupled to inputs of the L muxes 502N, 502E, and 502W. The output of the receiver 508E is coupled to inputs of the L muxes 502N, 502S, and 502W. The output of the receiver 508W is coupled to inputs of the L muxes 502N, 502S, and 502E. The L mux 502N includes one or more additional inputs 510N; the L mux 502S includes one or more additional inputs 510S; the L mux 502E includes one or more additional inputs 510E; and the L mux 502W includes one or more additional inputs 510W. The additional inputs 510 can be coupled to outputs of CLE slices either in one CLE or across different CLEs. In another example, the additional inputs 510 can be coupled to B muxes disposed between CLE slices and the external interconnect circuitry. In the example shown in FIG. 5, a signal received from one external contact can be routed to another external contact by controlling the multiplexers 502.

Figure 6:
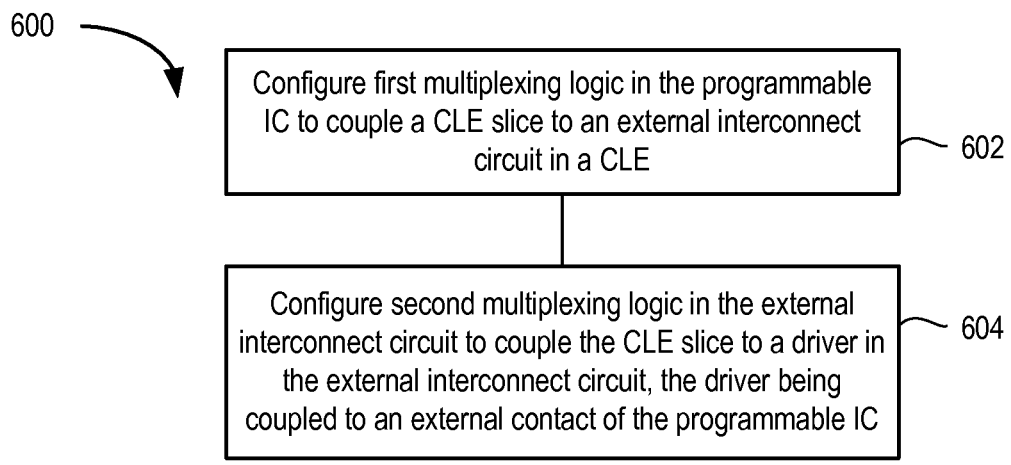
FIG. 6 is a flow diagram depicting a method of communication in an MCM according to an example.

FIG. 6 is a flow diagram depicting a method 600 of communication in an MOM according to an example. The method 600 begins at block 602, where first multiplexing logic in a programmable IC is configured to couple a CLE slice to an external interconnect circuit in a CLE. At block 604, second multiplexing logic in the programmable IC is configured to couple the CLE slice to a driver in the external interconnect circuit, where the driver is coupled to an external contact of the programmable IC. In an example, the first and second multiplexing logic can be the B muxes and L muxes, respectively, described in detail above.

While the foregoing is directed to specific examples, other and further examples may be devised without departing from the basic scope thereof, and the scope thereof is determined by the claims that follow.

What is claimed is:
1. A programmable integrated circuit (IC), comprising:
external contacts configured to interface with a substrate;
a plurality of configurable logic elements (CLEs) distributed across a programmable fabric;
a programmable interconnect in the programmable fabric coupled to the plurality of CLEs;
external interconnect circuits disposed between portions of the plurality of CLEs and the external contacts, the external interconnect circuits providing an electrical pathway between the portions of the plurality of CLEs and the external contacts without traversing the programmable interconnect;
wherein a plurality of the external interconnect circuits is disposed in the plurality of CLEs.
2. The programmable IC of claim 1, wherein the plurality of the external interconnect circuits includes at least one external interconnect circuit disposed in each of the plurality of CLEs.
3. The programmable IC of claim 2, wherein the at least one external interconnect circuit disposed in each of the plurality of CLEs includes at least four external interconnect circuits.
4. The programmable IC of claim 1, wherein, for each CLE of the plurality of CLEs, the respective plurality of the external interconnect circuits electrically couples a plurality of CLE slices disposed in the CLE with a plurality of the external contacts.

5. The programmable IC of claim 4, wherein the plurality of CLE slices disposed in each of the plurality of CLEs comprises multiplexers coupled to lookup table (LUT) logic, and wherein, for each CLE of the plurality of CLEs, the respective plurality of external interconnect circuits electrically couples the multiplexers with the respective plurality of the external contacts.

6. The programmable IC of claim 1, wherein each of the external interconnect circuits comprises at least one driver and receiver pair coupled to a respective at least one of the external contacts and multiplexing logic coupled to each of the at least one driver and receiver pair.

7. The programmable IC of claim 1, further comprising:
multiplexing logic coupled between the external interconnect circuits and the plurality of CLEs.

8. The programmable IC of claim 7, wherein the multiplexing logic is configurable to electrically couple one of the external interconnect circuits to another of the external interconnect circuits.

9. A multi-chip module, comprising:
a substrate;
a plurality of integrated circuit (IC) dies disposed on the substrate, the plurality of IC dies including a programmable IC die, the programmable IC die including:
external contacts configured to interface with the substrate;
a plurality of configurable logic elements (CLEs) distributed across a programmable fabric;
a programmable interconnect in the programmable fabric coupled to the plurality of CLEs;
external interconnect circuits disposed between portions of the plurality of CLEs and the external contacts, the external interconnect circuits providing an electrical pathway between the portions of the plurality of CLEs and the external contacts without traversing the programmable interconnect;
wherein a plurality of the external interconnect circuits is disposed in the plurality of CLEs; and
conductors disposed on the substrate electrically coupled to the external interconnect circuits through the external contacts.

10. The multi-chip module of claim 9, wherein first and second external interconnect circuits of the external interconnect circuits are electrically coupled to each other through a first conductor of the conductors and first and second external contacts of the external contacts.

11. The multi-chip module of claim 9, wherein a first external interconnect circuit of the external interconnect circuits is electrically coupled to a first IC die of the plurality of IC die through a first conductor of the conductors and a first external contact of the external contacts.

12. The multi-chip module of claim 9, wherein the plurality of the external interconnect circuits includes at least one external interconnect circuit disposed in each of the plurality of CLEs.

13. The multi-chip module of claim 12, wherein the at least one external interconnect circuit disposed in each of the plurality of CLEs comprises at least four external interconnect circuits.

14. The multi-chip module of claim 9, wherein, for each CLE of the plurality of CLEs, the respective plurality of the external interconnect circuits electrically couples a plurality of CLE slices disposed in the CLE with a plurality of the external contacts.

15. The multi-chip module of claim 14, wherein the plurality of CLE slices disposed in each of the plurality of CLEs comprises multiplexers coupled to lookup table (LUT) logic, and wherein, for each CLE of the plurality of CLEs, the respective plurality of external interconnect circuits electrically couples the multiplexers with the respective plurality of the external contacts.

16. The multi-chip module of claim 9, wherein each of the external interconnect circuits comprises at least one driver and receiver pair coupled to a respective at least one of the external contacts and multiplexing logic coupled to each of the at least one driver and receiver pair.

17. The multi-chip module of claim 9, wherein the programmable IC die further includes:
multiplexing logic coupled between the external interconnect circuits and the plurality of CLEs.

18. A method of communication in a multi-chip module having a programmable integrated circuit (IC), the programmable IC including a plurality of configurable logic elements (CLEs) distributed across a programmable fabric and a programmable interconnect in the programmable fabric coupled to the plurality of CLEs, the method comprising:
configuring first multiplexing logic in the programmable IC to couple a CLE slice of a CLE of the plurality of CLEs to an external interconnect circuit in the CLE without traversing the programmable interconnect; and
configuring second multiplexing logic in the external interconnect circuit to couple the CLE slice to a driver in the external interconnect circuit, the driver being coupled to an external contact of the programmable IC.

19. The method of claim 18, wherein the external contact is electrically coupled to another IC in the multi-chip module.

20. The method of claim 18, wherein the external contact is electrically coupled to another external contact of the programmable IC, the other external contract being coupled to a receiver in another external interconnect circuit of the programmable IC.

* * * * *